(12) United States Patent
Mathur et al.

(10) Patent No.: US 10,224,928 B1
(45) Date of Patent: Mar. 5, 2019

(54) ON-DIE IMPEDANCE CALIBRATION

(71) Applicant: Western Digital Technologies, Inc., San Jose, CA (US)

(72) Inventors: Shiv Harit Mathur, Bangalore (IN); Ramakrishnan Subramanian, Bangalore (IN); Nitin Gupta, Noida (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/934,379

(22) Filed: Mar. 23, 2018

(51) Int. Cl.
| | |
|---|---|
| *G11C 11/16* | (2006.01) |
| *H03K 19/003* | (2006.01) |
| *H03K 19/00* | (2006.01) |
| *H04L 25/02* | (2006.01) |
| *G11C 5/14* | (2006.01) |
| *G11C 7/10* | (2006.01) |
| *H03K 19/0175* | (2006.01) |
| *G11C 7/22* | (2006.01) |
| *H03K 17/693* | (2006.01) |
| *G11C 11/406* | (2006.01) |

(52) U.S. Cl.
CPC ......... *H03K 19/0005* (2013.01); *G11C 5/147* (2013.01); *G11C 7/1051* (2013.01); *G11C 7/1093* (2013.01); *G11C 7/222* (2013.01); *G11C 11/40615* (2013.01); *H03K 17/693* (2013.01); *H03K 19/017545* (2013.01); *H04L 25/0278* (2013.01); *G11C 2207/2254* (2013.01)

(58) Field of Classification Search
CPC ....... H03K 19/0005; H03K 19/017545; H03K 19/018557; H03K 19/018585; H03K 19/017581; H03K 17/167; H03K 19/00369; H03K 19/0175; H03K 2217/94031; H03K 17/002; H03K 17/161; H03K 17/687; H03K 17/6872; H03K 17/693; H03K 19/003; H03K 19/018521; H03K 19/17724; H04L 25/0278; H04L 25/0298; G11C 29/028; G11C 2207/2254; G11C 29/022; G11C 7/1057; G11C 29/50008; G11C 7/10; G11C 11/4093; G11C 7/1084; H03H 11/30; H03H 7/40; H03H 11/28; H01L 23/64; G06F 13/4086; G06F 3/061; H03M 1/1061; H03M 1/745
See application file for complete search history.

(56) References Cited

U.S. PATENT DOCUMENTS

| | | | | |
|---|---|---|---|---|
| 6,980,020 | B2 * | 12/2005 | Best | H04L 25/0278 |
| | | | | 326/30 |
| 7,068,065 | B1 * | 6/2006 | Nasrullah | H03K 19/0005 |
| | | | | 326/30 |
| 7,269,043 | B2 * | 9/2007 | Lee | G11C 5/04 |
| | | | | 365/201 |

(Continued)

*Primary Examiner* — Vibol Tan
(74) *Attorney, Agent, or Firm* — Kunzler, PC

(57) ABSTRACT

Apparatuses, systems, methods, and computer program products are disclosed for on-die impedance calibration. A calibration circuit determines a digital compensation value for an input/output driver. A calibration adjustment circuit provides a digital compensation value to a calibration circuit to produce an analog output corresponding to the digital compensation value. A feedback circuit provides an analog output as feedback to a calibration circuit to produce an analog compensation value.

20 Claims, 10 Drawing Sheets

(56) References Cited

U.S. PATENT DOCUMENTS

| | | | | |
|---|---|---|---|---|
| 8,638,838 B1* | 1/2014 | Betts | ......................... | H04L 5/16 |
| | | | | 326/30 |
| 8,742,780 B2* | 6/2014 | Kim | ................. | G01R 31/31717 |
| | | | | 324/750.3 |
| 8,793,525 B2* | 7/2014 | Zerbe | .................. | G06F 13/4243 |
| | | | | 713/401 |
| 8,878,564 B2* | 11/2014 | Araki | ............... | H03K 19/00369 |
| | | | | 324/108 |
| 9,444,445 B2* | 9/2016 | Chen | ...................... | H03K 3/353 |
| 9,563,213 B2* | 2/2017 | Addepalli | .............. | G11C 16/06 |
| 9,973,940 B1* | 5/2018 | Rappaport | ............ | H04W 16/18 |
| 2018/0075885 A1* | 3/2018 | Jung | .................... | G11C 7/1051 |

* cited by examiner

ON-DIE IMPEDANCE CALIBRATION

TECHNICAL FIELD

The present disclosure, in various embodiments, relates to impedance calibration and more particularly relates to impedance calibration for one or more integrated circuit devices.

BACKGROUND

Various factors may result in impedance variation in integrated circuits. For example, a process, a voltage, and/or a temperature corresponding to an integrated circuit may affect the impedance of the integrated circuit. Impedance variation in an integrated circuit may limit performance of the integrated circuit.

SUMMARY

Apparatuses are presented for on-die impedance calibration. In one embodiment, an apparatus includes a calibration circuit that determines a digital compensation value for an input/output driver. In certain embodiments, an apparatus includes a calibration adjustment circuit that provides a digital compensation value to a calibration circuit to produce an analog output corresponding to the digital compensation value. In various embodiments, an apparatus includes a feedback circuit that provides an analog output as feedback to a calibration circuit to produce an analog compensation value.

Methods are presented for on-die impedance calibration. In one embodiment, a method includes receiving a digital impedance input. In some embodiments, a method includes receiving an analog impedance input. In certain embodiments, a method includes providing a digital impedance input and an analog impedance input to an impedance matching circuit to produce an analog result. In various embodiments, a method includes determining a local digital impedance output based on a digital impedance input, an analog impedance input, and an analog result.

Additional apparatuses are presented for on-die impedance calibration. In one embodiment, an apparatus includes means for generating an analog impedance compensation value, for an electrical signal driver, based on a digital impedance compensation value. In some embodiments, an apparatus includes means for generating a local analog impedance compensation value at an electrical signal driver. In certain embodiments, an apparatus includes means for generating an output voltage based on a digital impedance compensation value, an analog impedance compensation value, and a local analog impedance compensation value.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
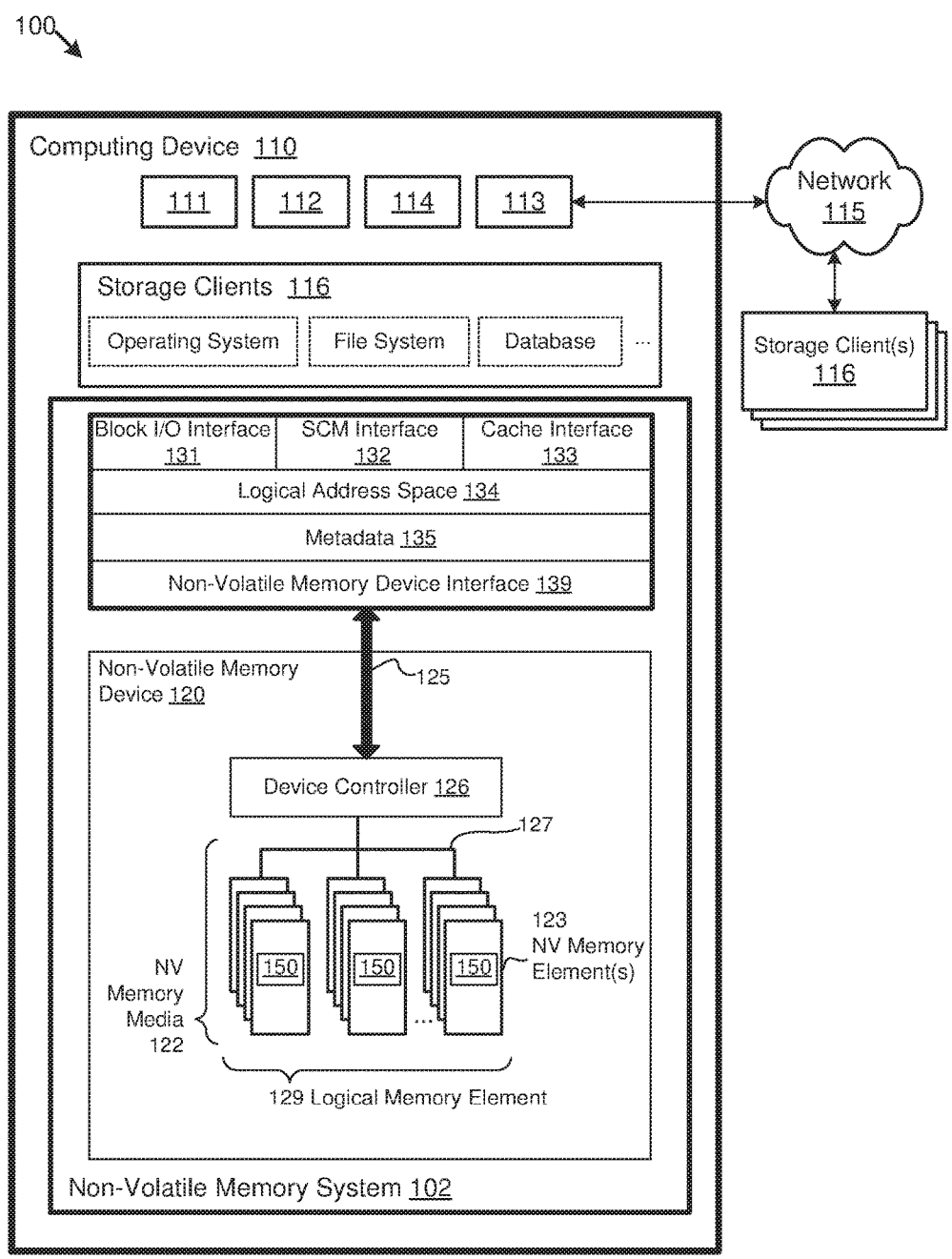
FIG. 1 is a schematic block diagram of one embodiment of a system comprising a calibration component.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification may have been labeled as modules in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not be limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising one or more calibration components 150 for a memory device 120 and/or another integrated circuit device 120. A calibration component 150 may be part of a memory element 123, and may be in communication with a device controller 126, a device driver, or the like. In some embodiments, a calibration component 150 may at least partially operate on and/or be in communication with a memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or device 126 to a communication network 115, such as an Internet Protocol (IP) network, a Storage Area Network (SAN), wireless network, wired network, or the like.

The memory device 120, in various embodiments, may be disposed in one or more different locations relative to the computing device 110. In one embodiment, the memory device 120 comprises one or more volatile and/or non-volatile memory elements 123, such as semiconductor chips, die, packages, or other integrated circuit devices disposed on one or more printed circuit boards, storage housings, and/or other mechanical and/or electrical support structures. For example, the memory device 120 may comprise one or more direct inline memory module (DIMM) cards, one or more expansion cards and/or daughter cards, a memory card, a universal serial bus (USB) drive, a solid-state-drive (SSD) or other hard drive device, and/or may have another memory and/or storage form factor. The memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the calibration component 150 may include one or more computer readable instructions stored on the non-transitory storage medium 114.

The memory system 102, in the depicted embodiment, includes one or more calibration components 150. A calibration component 150, in one embodiment, is configured to provide one or more digital compensation values, one or more analog compensation values, and/or other impedance calibration on-die from within a memory element 123 or other integrated circuit device 123 (e.g., in response to a single calibration command from a device controller 126, in response to receiving calibration data from a device controller 126 over a bus 127, without sending calibration data back to a device controller 126 over a bus 127, in response to being powered on, in response to a calibration interval, in response to a change in process, voltage, and/or temperature (PVT), and/or the like).

Certain signals (e.g., data signals, command signals, control signals, or the like) may depend on and/or be interpreted in view of one or more other signals (e.g., a clock signal, a timing signal, a compensation signal, or the like). Due to PVT and/or material variations in a memory element 123 or other integrated circuit device 123, a device controller 126, or both, there may be an impedance mismatch, or an impedance mismatch may develop over time due to operating conditions, damage, age, or the like.

Calibration, as used herein, may comprise the adjustment and/or synchronization of two or more impedances. For example, calibrating the impedance of a compensation circuit and an input/output (I/O) driver, in certain embodiments, may reduce or eliminate transmission errors (e.g., noise, signal quality, or the like) in data signal due to impedance mismatch. In one embodiment, a calibration component 150, may calibrate one or more signals for an integrated circuit device 123 at or near a manufacture time (e.g., during die sort or another testing process by a manufacturer, vendor, distributor, or the like). In a further embodiment, a calibration component 150 may calibrate one or more signals for an integrated circuit device 123 periodically, in response to one or more triggers (e.g., in response to a calibration command from a device controller 126, a startup or power-on process for the integrated circuit device 123 and/or for a memory device 120, detecting a timing or other data error on the integrated circuit device 123, a background calibration process, a change in PVT beyond a threshold, or the like).

In this manner, a calibration component 150, in certain embodiments, may perform impedance calibration from within a die 123 faster than a device controller 126 could perform the calibration for the die 123 externally (e.g., by eliminating the transmission of calibration data back to the device controller 150 on the bus 127, by allowing multiple die 123 to calibrate themselves in parallel and/or simultaneously, or the like). For example, in certain embodiments, a device 120 may include multiple integrated circuit chips 123, die 123, and/or die planes 123, each of which may comprise one or more calibration components 150, to independently calibrate impedances separately from within the die 123. Multiple die 123 and/or die planes 123, in one embodiment, may be stacked or otherwise combined in a multi-die 123 arrangement (e.g., after manufacture), during which process, an impedance calibration and/or characterization for a die 123 may change from when it was initially manufactured. Further, in some embodiments, an impedance calibration and/or characterization for a die 123 may change over time, in the field, due to wear and/or damage of the die 123 through use, or the like. A calibration component 150, in certain embodiments, may dynamically update, recharacterize, and/or recalibrate an impedance for a die 123 over time (e.g., after combining multiple die 123 at or near manufacture time, in the field during runtime, or the like).

In one embodiment, a device controller 126 may send a calibration command and/or calibration data to one or more memory elements 123 and/or other integrated circuit devices, in response to which an on-die calibration component 150 may perform one or more calibration operations.

In one embodiment, a calibration component 150 may comprise logic hardware of a memory element 123, other programmable logic, firmware for a memory element 123, microcode for execution by a memory element 123, or the like. In another embodiment, a calibration component 150 may comprise executable software code, stored on a computer readable storage medium for execution by logic hardware of a memory element 123. In a further embodiment, a calibration component 150 may include a combination of both executable software code and logic hardware.

In one embodiment, the calibration component 150 is configured to receive storage requests from a device driver or other executable application via buses 125, 127, a device controller 126, or the like. The calibration component 150 may be further configured to transfer data to/from a device driver and/or storage clients 116 via the bus 125. Accordingly, the calibration component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the calibration component 150 may receive storage requests as an API call from a storage client 116, as an IO-CTL command, or the like. The calibration component 150 is described in further detail below with regard to FIG. 3.

According to various embodiments, a device controller 126 may manage one or more memory devices 120 and/or memory elements 123. The memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 120). Memory units may include, but are not limited to: pages, memory divisions, blocks, sectors, collections or sets of physical storage locations (e.g., logical pages, logical blocks), or the like.

A device driver and/or the device controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the memory device 120 may maintain metadata 135, such as a logical to physical address mapping structure, to map logical addresses of the logical address space 134 to media storage locations on the memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more memory devices 120. The one or more memory devices 120 may include different types of memory devices including, but not limited to: volatile memory devices, solid-state storage devices, semiconductor storage devices, SAN storage resources, or the like. The one or more memory devices 120 may comprise one or more respective device controllers 126 and memory media 122. A device driver may provide access to the one or more memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the memory device 120. Also, in some embodiments, the SCM interface 132 presented to the storage clients 116 provides access to data transformations implemented by the one or more memory devices 120 and/or the one or more device controllers 126.

A device driver may present a logical address space 134 to the storage clients 116 through one or more interfaces. As discussed above, the logical address space 134 may comprise a plurality of logical addresses, each corresponding to respective media locations the on one or more memory devices 120. A device driver may maintain metadata 135 comprising any-to-any mappings between logical addresses and media locations, or the like.

A device driver may further comprise and/or be in communication with a memory device interface 139 configured to transfer data, commands, and/or queries to the one or more memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The memory device interface 139 may communicate with the one or more memory devices 120 using input-output control (IO-CTL) command(s), IO-CTL command extension(s), remote direct memory access, or the like.

The communication interface 113 may comprise one or more network interfaces configured to communicatively couple the computing device 110 and/or the device controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The device controller 126 is part of and/or in communication with one or more memory devices 120. Although FIG. 1 depicts a single memory device 120, the disclosure is not limited in this regard and could be adapted to incorporate any number of memory devices 120.

The memory device 120 may comprise one or more elements 123 of volatile and/or non-volatile memory media 122, which may include but is not limited to: volatile memory such as SRAM and/or DRAM; non-volatile memory such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), and/or optical storage media; or other memory and/or storage media. The one or more elements 123 of memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the memory media 122 is referred to herein as "memory media," in various embodiments, the memory media 122 may more generally comprise one or more volatile and/or non-volatile recording media capable of recording data, which may be referred to as a memory medium, a storage medium, or the like. Further, the memory device 120, in various embodiments, may comprise a recording device, a memory device, a storage device, or the like. Similarly, a memory element 123, in various embodiments, may comprise a recording element, a memory element, a storage element, or the like. In other embodiments, a memory element 123 may comprise a different type of integrated circuit device (e.g., an ASIC, a CPU, a communications device, a graphics device, a system on a chip, a programmable logic device, or the like), and memory elements 123 are used only by way of example as one type of integrated circuit device (e.g., integrated circuit die, chip, die plane, package, or the like) for which the calibration component 150 may calibrate one or more impedances, and other types of integrated circuit devices are contemplated within the scope of this disclosure.

The memory media 122 may comprise one or more memory elements 123, which may include, but are not limited to: chips, packages, planes, die, or the like. A device controller 126 may be configured to manage data operations on the memory media 122, and may comprise one or more processors, programmable processors (e.g., FPGAs), ASICs, micro-controllers, or the like. In some embodiments, the device controller 126 is configured to store data on and/or read data from the memory media 122, to transfer data to/from the memory device 120, and so on.

The device controller 126 may be communicatively coupled to the memory media 122 by way of a bus 127. The bus 127 may comprise an I/O bus for communicating data to/from the memory elements 123. The bus 127 may further comprise a control bus for communicating addressing and other command and control information to the memory elements 123. In some embodiments, the bus 127 may communicatively couple the memory elements 123 to the device controller 126 in parallel. This parallel access may allow the memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the memory elements 123.

The device controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the memory system 102. A device driver may further comprise a memory device interface 139 that is configured to transfer data, commands, and/or queries to the device controller 126 over a bus 125, as described above.

Figure 2:
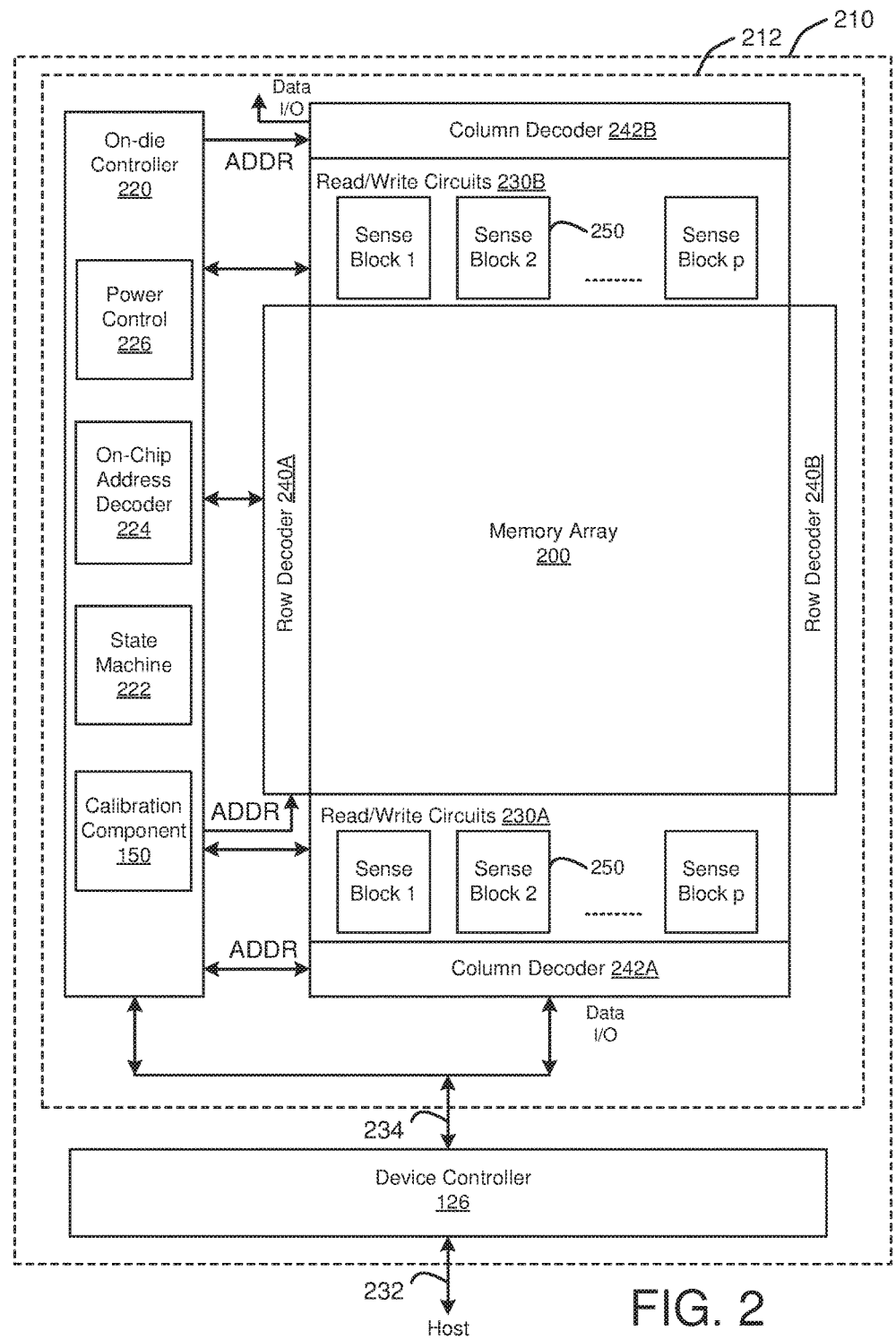
FIG. 2 is a schematic block diagram illustrating another embodiment of a system comprising a calibration component.

FIG. 2 depicts one embodiment of a storage device 210 that may include one or more memory die or chips 212, and/or another type of integrated circuit device 212. The storage device 210 may be substantially similar to the memory device 120 described with reference to FIG. 1. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a device controller 126 is included in the same memory device 210 (e.g., a removable storage card or package) as the one or more memory die 212. Commands and data are transferred between the host and the device controller 126 via lines 232 and between the device controller 126 and the one or more memory die 212 via lines 234. One implementation can include multiple chips 212, a chip 212 may include multiple die 212 and/or die planes 212, or the like.

The die controller 220, in one embodiment, cooperates with the read/write circuits 230A/230B to perform memory operations on the memory array 200. The die controller 220, in certain embodiments, includes a calibration component 150, a state machine 222, an on-die address decoder 224, and a power control circuit 226. The calibration component 150, in one embodiment, is configured to receive one or more calibration commands and/or calibration data from the device controller 126 over the bus 234 and an active path of the die/chip 212 (e.g., from an I/O contact or pad on an outer surface of the die/chip 212, through various communications circuitry to a data buffer and/or latches for the memory array 200, or the like). The calibration component 150 may detect and/or determine one or more impedances of the die/chip 212 to be calibrated and may calibrate the one or more impedances of the die/chip 212.

The state machine 222, in one embodiment, provides chip-level control of memory operations. The on-die address decoder 224 provides an address interface to convert between the address that is used by the host or a memory controller to the hardware address used by the decoders 240A, 240B, 242A, 242B. The power control circuit 226 controls the power and voltages supplied to the word lines and bit lines during memory operations. In one embodiment, power control circuit 226 includes one or more charge pumps that can create voltages larger than the supply voltage.

In certain embodiments, the state machine 222 includes an embodiment of the calibration component 150. The calibration component 150, in certain embodiments, may include software, firmware, and/or hardware in a die controller 220 and/or a state machine 222.

In one embodiment, one or any combination of die controller 220, calibration component 150, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 126 can be referred to as one or more managing circuits.

Figure 3:
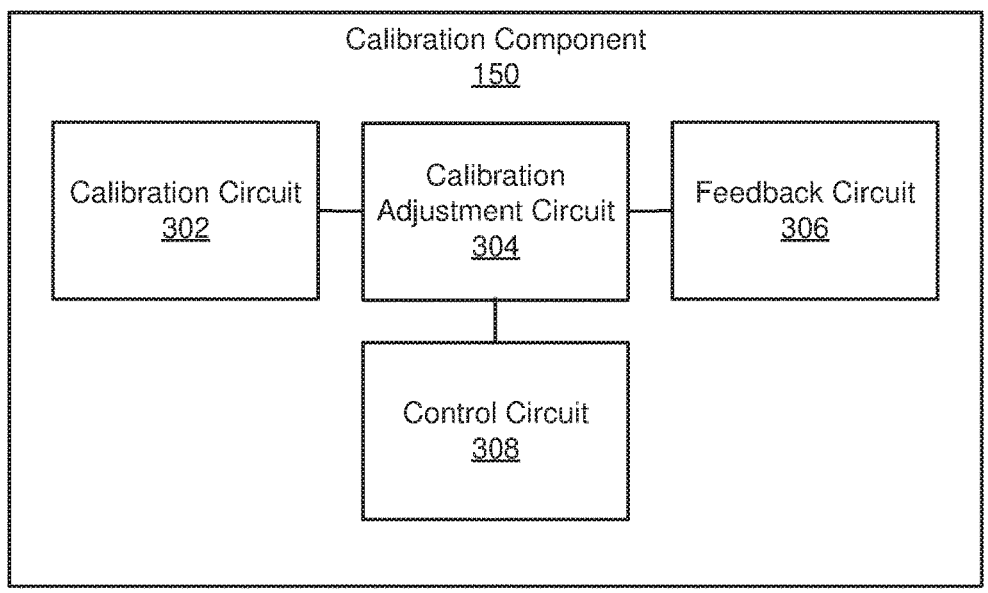
FIG. 3 is a schematic block diagram illustrating one embodiment of a calibration component.

FIG. 3 depicts one embodiment of a calibration component 150. The calibration component 150 may be substantially similar to the calibration component 150 described above with regard to FIG. 1 and FIG. 2. In general, as described above, the calibration component 150 is configured to determine a digital compensation value, an analog compensation value, and a local digital compensation value for an I/O driver. In the depicted embodiment, the calibration component 150 includes a calibration circuit 302, a calibration adjustment circuit 304, a feedback circuit 306, and a control circuit 308, which may be part of an on-die controller or other on-die circuitry.

In one embodiment, the calibration circuit 302 determines a digital compensation value for an I/O driver. The digital compensation value may be used to activate gates of selected transistors of the calibration circuit 302 and/or the I/O driver to change an impedance of the calibration circuit 302 and/or the I/O driver. In some embodiments, the digital compensation value is determined from an analog value. For example, the digital compensation value may be determined by comparing the analog value to a reference voltage, then adjusting the digital compensation value based on the difference between the analog value and the reference voltage.

In various embodiments, the digital compensation value is rounded down to a nearest digital value that has an analog equivalent that is less than the analog value. By rounding down to a nearest digital value that has an analog equivalent that is less than the analog value, there may be availability to add an analog compensation component to the analog equivalent to result in the analog value. For example, if the digital value has an analog equivalent of 2.6 volts and the analog value is 2.5 volts, the digital value may be reduced by one so that the analog equivalent of the digital value is 2.4 volts so that the analog equivalent is less than the analog value of 2.5 volts. If the digital value was left unchanged, no positive analog voltage could be added to 2.6 volts to reach 2.5 volts; however, with the digital value reduced by one, 0.1 volts can be added to 2.4 volts to reach 2.5 volts.

In certain embodiments, the calibration circuit 302 produces a calibration completion output in response to determining the digital compensation value. The calibration completion output may be used by various components to initiate determining an analog compensation value in response to the digital compensation value being determined. In some embodiments, the calibration circuit 302 determines multiple digital compensation values. For example, the calibration circuit 302 may determine a positive digital compensation value and/or a negative digital compensation value.

In one embodiment, the calibration adjustment circuit 304 provides a digital compensation value to the calibration circuit 302 to produce an analog output corresponding to the digital compensation value. Accordingly, the analog output corresponding to the digital compensation value may be compared to a reference voltage to determine how close the analog output is to a desired voltage. In various embodiments, the feedback circuit 306 provides the analog output as feedback to the calibration circuit 302 to produce an analog compensation value. In some embodiments, the analog value is a sum of an analog equivalent of the digital compensation value and the analog compensation value. For example, if the analog equivalent of the digital compensation value is 2.4 volts and the analog compensation value is 0.1 volts, then the analog value may be 2.5 volts.

In certain embodiments, the feedback circuit 306 produces an analog compensation value in response to a calibration completion output being produced. In such embodiments, the feedback circuit 306 may provide the analog compensation value to an I/O driver for use by the I/O driver. In various embodiments, the feedback circuit 306 includes an amplifier that outputs the analog compensation value based on inputs including an analog output and a reference voltage based on a supply voltage. The analog output provides feedback to the amplifier that changes as the analog compensation value changes. In some embodiments, the feedback circuit 306 determines multiple analog compensation values, such as a positive analog compensation value and/or a negative analog compensation value.

In some embodiments, the control circuit 308 receives an indication of the calibration completion output and provides an enable output to the feedback circuit to enable the feedback circuit 306. The calibration completion output may indicate the completion of determining one or more digital compensation values. By enabling the feedback circuit 306, one or more analog compensation values may be determined. In certain embodiments, the control circuit 308 provides a calibration adjustment completion output in response to producing an analog compensation value. In such embodiments, the calibration adjustment completion output may indicate that both one or more digital compensation values and one or more analog compensation values have been determined. Moreover, the calibration adjustment completion output may indicate that calibration performed by the calibration component 150 is complete.

As described above with regard to FIGS. 1 and 2, a memory device 120 may include one or more memory elements 123 or dies 123. In other embodiments, a die 123 may comprise a different type of integrated circuit, instead of or in addition to comprising memory (e.g., an ASIC, a CPU, a communications device, a graphics device, a system on a chip, a programmable logic device, or the like). In various embodiments, an on-die controller 220 may refer to a component on a die, control/operation logic on a die, a set of components on a die, or the like, that controls data operations for a memory array 200 on the die.

Figure 4:
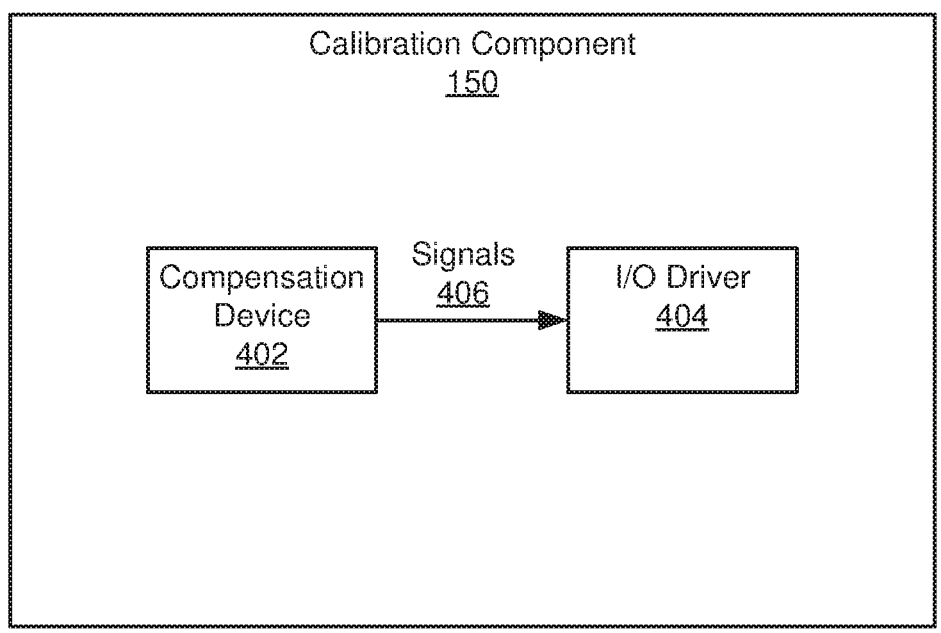
FIG. 4 is a schematic block diagram illustrating another embodiment of a calibration component.

FIG. 4 depicts another embodiment of a calibration component 150. The calibration component 150 may be substantially similar to the calibration component 150 described above with regard to FIG. 1 and FIG. 2. In general, as described above, the calibration component 150 is configured to determines a digital compensation value (e.g., digital impedance), an analog compensation value (e.g., analog impedance), and a local digital compensation value (e.g., local digital impedance) for an I/O driver. In the depicted embodiment, the calibration component 150 includes a compensation device 402 and an I/O driver 404, which may be part of an on-die controller or other on-die circuitry.

In one embodiment, the compensation device 402 includes hardware and/or software that may have similar components to the I/O driver 404. In certain embodiments, the compensation device 402 may be used to determine an adjustment to an impedance of circuitry of the compensation device 402 that is substantially similar to an adjustment that can be used for an impedance of the I/O driver 404. The adjustment to the impedance may be used to compensate for changes due to PVT. The compensation device 402 may determine one or more digital and/or analog compensation values for use by the I/O driver 404, and may provide the one or more digital and/or analog compensation values as signals 406 to the I/O driver 404 for use during operation of the I/O driver 404.

In certain embodiments, the I/O driver 404 (e.g., I/O driver, IO driver, etc.) may be used to drive input and/or output operations. The I/O driver 404 may receive one or more digital and/or analog compensation values as the signals 406 from the compensation device 402 in order to adjust an internal impedance that may change based on PVT, among other things. In some embodiments, the I/O driver 404 may determine additional digital and/or analog compensation values based at least partly on the one or more digital and/or analog compensation values received from the compensation device 402. In various embodiments, the compensation device 402 and/or the I/O driver 404 may perform calibration in response to a cold start (e.g., on power up), at a predetermined interval (e.g., time, operations performed, clock cycles), and/or in response to a change in environment (e.g., PVT, detection of a change in temperature by use of a temperature sensor, and so forth).

Figure 5:
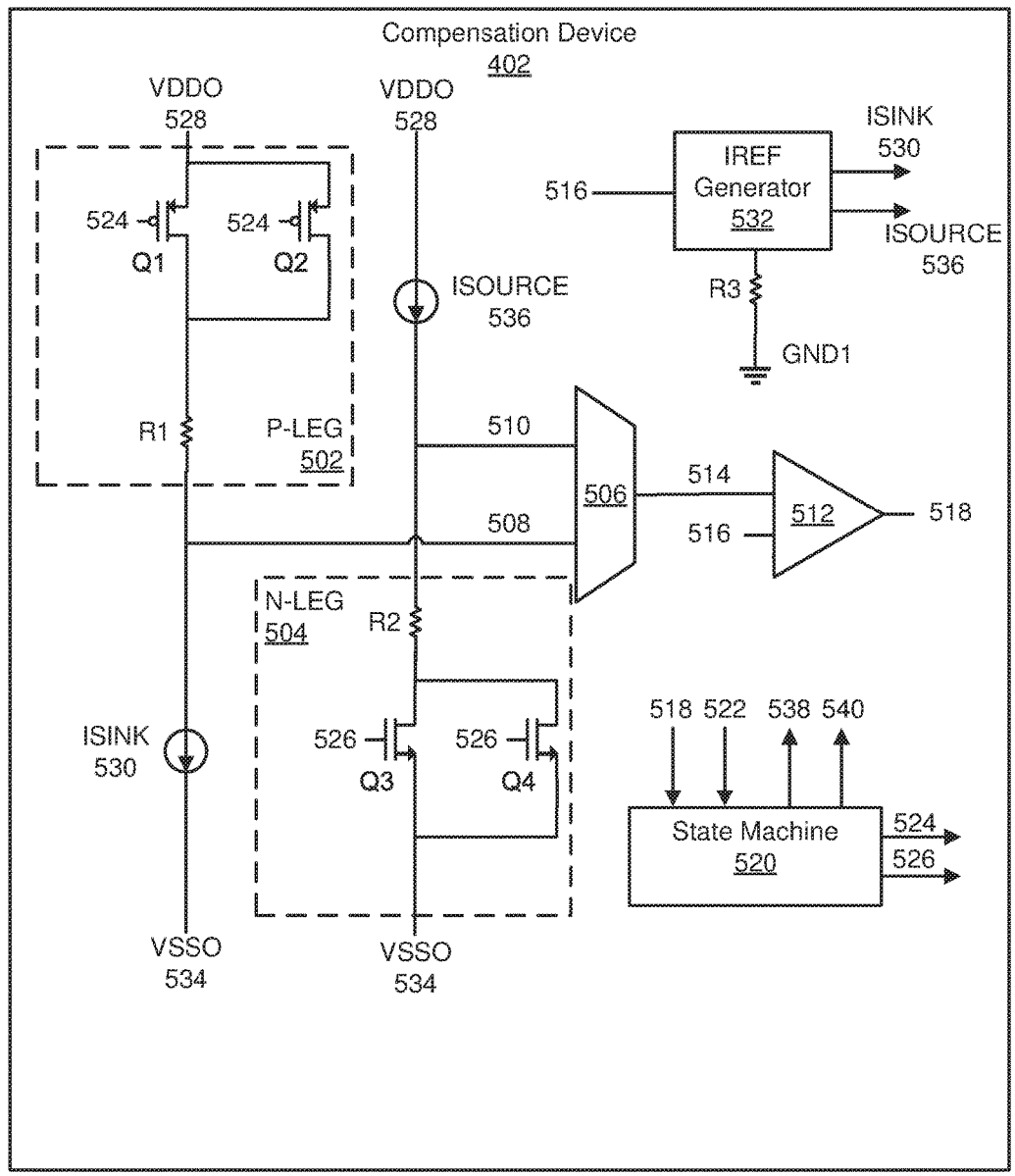
FIG. 5 is a schematic block diagram illustrating one embodiment of a compensation device.

FIG. 5 depicts one embodiment of the compensation device 402. The compensation device 402 includes a pull-up impedance circuit 502 (e.g., p-leg) and a pull-down impedance circuit 504 (e.g., n-leg). In some embodiments, the pull-up impedance circuit 502 and/or the pull-down impedance circuit 504 may be substantially similar to one or more circuits in the I/O driver 404. The pull-up impedance circuit 502 and the pull-down impedance circuit 504 produce output voltages that are provided to a multiplexer 506. Specifically, a first voltage 508 (e.g., positive mid voltage, pmid) is produced from the pull-up impedance circuit 502, and a second voltage 510 (e.g., negative mid voltage, nmid) is produced from the pull-down impedance circuit 504. The multiplexer 506 selects one of the first voltage 508 and the second voltage 510 to provide to a comparator 512. In some embodiments, a controller or another device described herein controls the multiplexer 506 to select either the first voltage 508 or the second voltage 510.

The multiplexer 506 may be any suitable device capable of selecting an input to provide as an output. For example, the multiplexer 506 may include hardware and/or software capable of selecting an input to provide as an output. In certain embodiments, the multiplexer 506 may be replaced with two comparators to enable concurrent (e.g., parallel) compensation determination for both of the pull-up impedance circuit 502 and the pull-down impedance circuit 504. Moreover, the comparator 512 may be any suitable device capable of comparing two or more inputs and providing an output based on the comparison. For example, the comparator 512 may include hardware and/or software capable of comparing two or more inputs and providing an output based on the comparison.

In the illustrated embodiment, the comparator 512 receives a multiplexer output 514 at a first input and receives a reference voltage 516 at a second input. In some embodiments, the reference voltage 516 may be approximately half of a positive supply voltage (e.g., VDDO/2). In other embodiments, the reference voltage 516 may be any suitable voltage. The comparator 512 compares its first and second inputs and produces a comparison output 518 based on the comparison. The comparison output 518 is used as feedback to control the multiplexer output 514 toward the reference voltage 516 so that the multiplexer output 514 is substantially equal to the reference voltage 516 (e.g., the multiplexer output 514 is approximately equal to the reference voltage 516, the multiplexer output 514 is within 1%, 2%, 5%, 10%, and/or 15% of the reference voltage 516, or the like) based on a quantization limit of the design.

In one embodiment, a state machine 520 receives the comparison output 518 and a clock signal 522 and determines a pull-up impedance code 524 and a pull-down impedance code 526. In some embodiments, the state machine 520 may be substantially similar to the state machine 222 described herein. In one embodiment, the state machine 520 may be an integrated circuit, while in other embodiments, the state machine 520 may be entirely software, entirely hardware, and/or a combination of hardware and software. The state machine 520 may control an operational state of the compensation device 402.

The pull-up impedance code 524 is provided from the state machine 520 to the pull-up impedance circuit 502 to control an impedance of the pull-up impedance circuit 502. By controlling the impedance of the pull-up impedance circuit 502, the first voltage 508 is controlled. The pull-up impedance code 524 may be a digital code that includes one bit per transistor in the pull-up impedance circuit 502. For example, the pull-up impedance code 524 may be a digital code that includes a first bit provided to transistor Q1 and a second bit provided to transistor Q2. As may be appreciated, the pull-up impedance circuit 502 may have any suitable number of transistors (e.g., 1, 2, 3, 4, 5, 6, 7, 8, 10, 20, etc.) coupled to a resistor R1. Accordingly, the pull-up impedance code 524 may have any suitable number of bits (e.g., 1, 2, 3, 4, 5, 6, 7, 8, 10, 20, etc.).

In response to the comparison output 518 indicating that the multiplexer output 514 is greater than the reference voltage 516, the state machine 520 may adjust the pull-up impedance code 524 to turn off one or more transistors of the pull-up impedance circuit 502 (e.g., if the multiplexer 506 selects the first voltage 508 as the multiplexer output 514). By turning off one or more transistors of the pull-up impedance circuit 502, the impedance of the pull-up impedance circuit 502 may increase, thereby reducing the first voltage 508 provided to the multiplexer 506. Thus, the multiplexer output 514 (e.g., if the first voltage 508 is selected) may be reduced toward the reference voltage 516.

In response to the comparison output 518 indicating that the multiplexer output 514 is less than the reference voltage 516, the state machine 520 may adjust the pull-up impedance code 524 to turn on one or more transistors of the pull-up impedance circuit 502 (e.g., if the multiplexer 506 selects the first voltage 508 as the multiplexer output 514). By turning on one or more transistors of the pull-up impedance circuit 502, the impedance of the pull-up impedance circuit 502 may decrease, thereby increasing the first voltage 508 provided to the multiplexer 506. Thus, the multiplexer output 514 (e.g., if the first voltage 508 is selected) may be increased toward the reference voltage 516.

As may be appreciated, the state machine 520 may continue to adjust the pull-up impedance code 524 to turn on and/or off transistors until the first voltage 508 is as close as possible to the reference voltage 516.

In the illustrated embodiment of FIG. 5, the first voltage 508 is produced by providing a positive supply voltage 528 (e.g., VDDO) to one side of the pull-up impedance circuit 502. The positive supply voltage 528 may be any suitable positive voltage. Furthermore, a first current source 530 (e.g., ISINK) is provided to another side of the pull-up impedance circuit 502. The first current source 530 is produced by a reference current generator 532 (e.g., IREF generator) that uses the reference voltage 516 as an input and determines the first current source 530 based on the reference voltage 516 and a resistor R3. In one embodiment, the first current source 530 may have a current equal to the reference voltage 516 divided by the resistor R3. In some embodiments, the resistor R3 may be an external resistor. The first current source 530 directs current flow between the positive supply voltage 528 and a negative supply voltage 534 (e.g., VSSO). The negative supply voltage 534 may be any suitable negative voltage and may be substantially equal to the positive supply voltage 528 but opposite in polarity. For example, if the positive supply voltage 528 is +5 volts, the negative supply voltage 534 may be −5 volts.

The pull-down impedance code 526 is provided from the state machine 520 to the pull-down impedance circuit 504 to control an impedance of the pull-down impedance circuit 504. By controlling the impedance of the pull-down impedance circuit 504, the second voltage 510 is controlled. The pull-down impedance code 526 may be a digital code that includes one bit per transistor in the pull-down impedance circuit 504. For example, the pull-down impedance code 526 may be a digital code that includes a first bit provided to transistor Q3 and a second bit provided to transistor Q4. As may be appreciated, the pull-down impedance circuit 504 may have any suitable number of transistors (e.g., 1, 2, 3, 4, 5, 6, 7, 8, 10, 20, etc.) coupled to a resistor R2. Accordingly, the pull-down impedance code 526 may have any suitable number of bits (e.g., 1, 2, 3, 4, 5, 6, 7, 8, 10, 20, etc.).

In response to the comparison output 518 indicating that the multiplexer output 514 is greater than the reference voltage 516, the state machine 520 may adjust the pull-down impedance code 526 to turn off one or more transistors of the pull-down impedance circuit 504 (e.g., if the multiplexer 506 selects the second voltage 510 as the multiplexer output 514). By turning off one or more transistors of the pull-down impedance circuit 504, the impedance of the pull-down impedance circuit 504 may increase, thereby reducing the second voltage 510 provided to the multiplexer 506. Thus, the multiplexer output 514 (e.g., if the second voltage 510 is selected) may be reduced toward the reference voltage 516.

In response to the comparison output 518 indicating that the multiplexer output 514 is less than the reference voltage 516, the state machine 520 may adjust the pull-down impedance code 526 to turn on one or more transistors of the pull-down impedance circuit 504 (e.g., if the multiplexer 506 selects the second voltage 510 as the multiplexer output 514). By turning on one or more transistors of the pull-down impedance circuit 504, the impedance of the pull-down impedance circuit 504 may decrease, thereby increasing the second voltage 510 provided to the multiplexer 506. Thus, the multiplexer output 514 (e.g., if the second voltage 510 is selected) may be increased toward the reference voltage 516.

As may be appreciated, the state machine 520 may continue to adjust the pull-down impedance code 526 to turn on and/or off transistors until the second voltage 510 is as close as possible to the reference voltage 516.

In the illustrated embodiment of FIG. 5, the second voltage 510 is produced by providing the negative supply voltage 534 to one side of the pull-down impedance circuit 504. The negative supply voltage 534 may be any suitable negative voltage. Furthermore, a second current source 536 (e.g., ISOURCE) is provided to another side of the pull-down impedance circuit 504. The second current source 536 is produced by the reference current generator 532. In one embodiment, the second current source 536 may have a current equal to the reference voltage 516 divided by the resistor R3. In some embodiments, the resistor R3 may be an external resistor. The second current source 536 directs current flow between the negative supply voltage 534 and the positive supply voltage 528.

To perform a calibration operation, in one embodiment, the state machine 520 may first control the multiplexer 506 to output the first voltage 508 as the multiplexer output 514. In other embodiments, a device separate from the state machine 520 (e.g., such as a controller described herein) may control the multiplexer 506 to output the first voltage 508 as the multiplexer output 514. Then, the state machine 520 may adjust the pull-up impedance code 524 until the comparison output 518 indicates that the multiplexer output 514 is as close as possible to the reference voltage 516. Next, the state machine 520 may output a pull-up impedance completion output indicator 538 (e.g., pdone) to indicate that the pull-up impedance code 524 is determined. In one embodiment, the state machine 520 may next control the multiplexer 506 to output the second voltage 510 as the multiplexer output 514. In other embodiments, a device separate from the state machine 520 (e.g., such as a controller described herein) may control the multiplexer 506 to output the second voltage 510 as the multiplexer output 514 in response to receiving the pull-up impedance completion output indicator 538. Then, the state machine 520 may adjust the pull-down impedance code 526 until the comparison output 518 indicates that the multiplexer output 514 is as close as possible to the reference voltage 516. Next, the state machine 520 may output a pull-down impedance completion output indicator 540 (e.g., ndone) to indicate that the pull-down impedance code 526 is determined. In various embodiments, the state machine 520 may first determine the pull-down impedance code 526, then determine the pull-up impedance code 524. In certain embodiments, the pull-up impedance code 524 and/or the pull-down impedance code 526 may be provided to the I/O driver 404, such as in response to the pull-up impedance completion output indicator 538 and the pull-down impedance completion output indicator 540 indicating that the calibration is complete.

As may be appreciated, the pull-up impedance code 524 and/or the pull-down impedance code 526 may result in the corresponding first voltage 508 and/or second voltage 510 differing slightly from the reference voltage 516. For example, a five-bit pull-up impedance code 524 of "10110" may produce a first voltage 508 of 2.42 volts and a five-bit pull-up impedance code 524 of "10111" may produce a first voltage 508 of 2.52 volts. Each of these pull-up impedance codes 524 produce a first voltage 508 that differs slightly from a reference voltage 516 of 2.50 volts. However, because the pull-up impedance code 524 is a digital value, it may not be able to equal the reference voltage 516. Such variation may result in errors produced by the I/O driver 404 using the pull-up impedance code 524 and/or the pull-down impedance code 526.

The transistors Q1, Q2, Q3, and Q4 may be any suitable transistors. In certain embodiments, the transistors Q1, Q2, Q3, and Q4 may be field-effect transistors (FETs), such as metal-oxide-semiconductor FETs (MOSFETs). Moreover, in some embodiments, Q1 and Q2 may be negative MOSFETs (NMOS), and Q3 and Q4 may be positive MOSFETs (PMOS). In other embodiments, Q1 and Q2 may be PMOS, and Q3 and Q4 may be NMOS.

Figure 6:
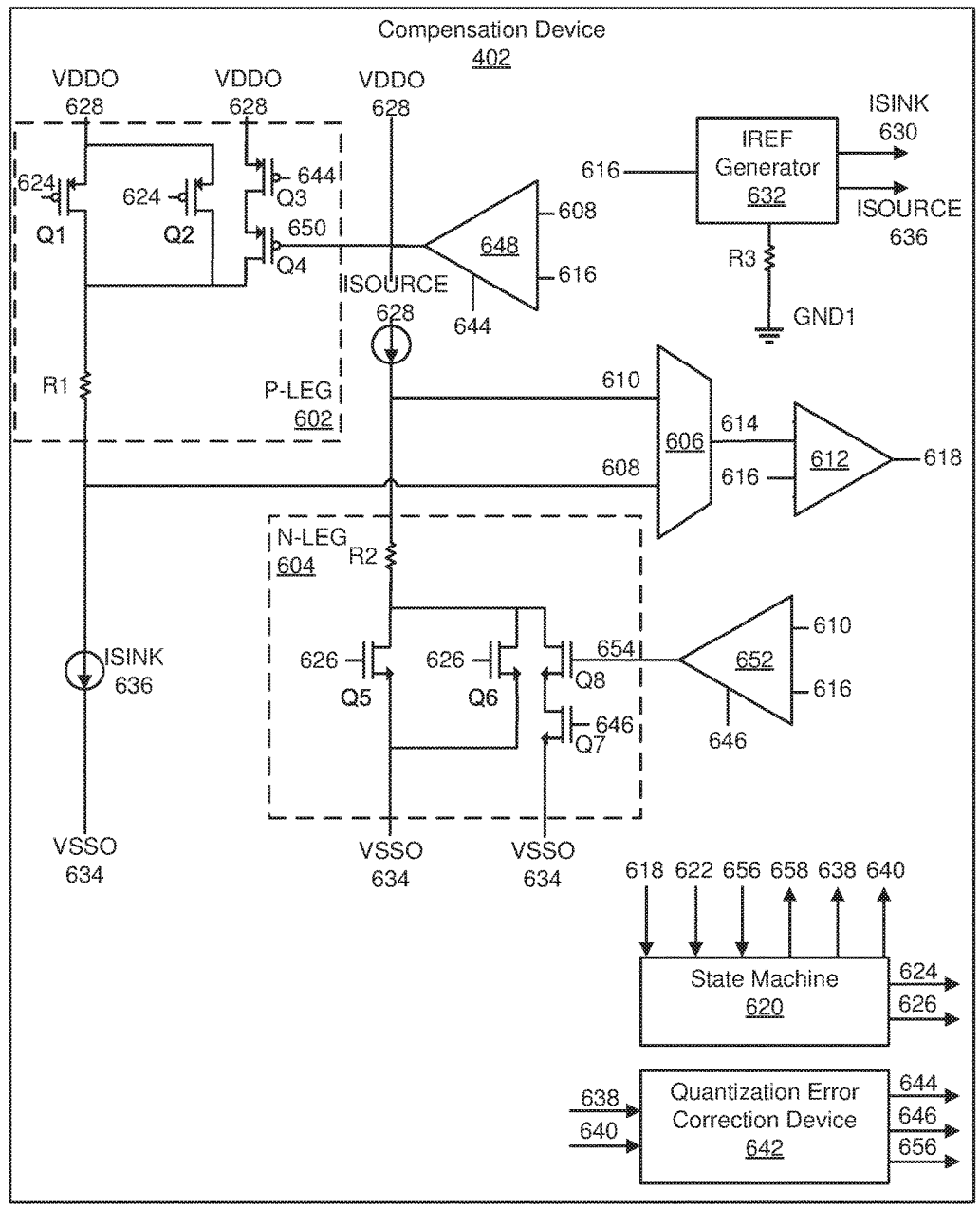
FIG. 6 is a schematic block diagram illustrating another embodiment of a compensation device.

FIG. 6 depicts another embodiment of the compensation device 402. The compensation device 402 includes a pull-up impedance circuit 602 (e.g., p-leg) and a pull-down impedance circuit 604 (e.g., n-leg). In some embodiments, the pull-up impedance circuit 602 and/or the pull-down impedance circuit 604 may be substantially similar to one or more circuits in the I/O driver 404. The pull-up impedance circuit 602 and the pull-down impedance circuit 604 produce output voltages that are provided to a multiplexer 606. Specifically, a first voltage 608 (e.g., positive mid voltage, pmid, analog output) is produced from the pull-up impedance circuit 602, and a second voltage 610 (e.g., negative mid voltage, nmid, analog output) is produced from the pull-down impedance circuit 604. The multiplexer 606 selects one of the first voltage 608 and the second voltage 610 to provide to a comparator 612. In some embodiments, a controller or another device described herein controls the multiplexer 606 to select either the first voltage 608 or the second voltage 610.

The multiplexer 606 may be any suitable device capable of selecting an input to provide as an output. For example, the multiplexer 606 may include hardware and/or software capable of selecting an input to provide as an output. Moreover, the comparator 612 may be any suitable device capable of comparing two or more inputs and providing an output based on the comparison. For example, the comparator 612 may include hardware and/or software capable of comparing two or more inputs and providing an output based on the comparison.

In the illustrated embodiment, the comparator 612 receives a multiplexer output 614 at a first input and receives a reference voltage 616 at a second input. In some embodiments, the reference voltage 616 may be approximately half of a positive supply voltage (e.g., VDDO/2). In other embodiments, the reference voltage 616 may be any suitable voltage. The comparator 612 compares its first and second inputs and produces a comparison output 618 based on the comparison. The comparison output 618 is used as feedback to control the multiplexer output 614 toward the reference voltage 616 so that the multiplexer output 614 is substantially equal to the reference voltage 616 (e.g., the multiplexer output 614 is approximately equal to the reference voltage 616, the multiplexer output 614 is within 1%, 2%, 5%, 10%, and/or 15% of the reference voltage 616, or the like).

In one embodiment, a state machine 620 receives the comparison output 618 and a clock signal 622 and determines a pull-up impedance code 624 (e.g., digital compensation value, digital impedance compensation value, digital impedance) and a pull-down impedance code 626 (e.g., digital compensation value, digital impedance compensation value, digital impedance). In some embodiments, the state machine 620 may be substantially similar to the state machine 222 and/or the state machine 520 described herein. In one embodiment, the state machine 620 may be an integrated circuit, while in other embodiments, the state machine 620 may be entirely software, entirely hardware, and/or a combination of hardware and software. The state machine 620 may control an operational state of the compensation device 402.

The pull-up impedance code 624 is provided from the state machine 620 to the pull-up impedance circuit 602 to control an impedance of the pull-up impedance circuit 602. By controlling the impedance of the pull-up impedance circuit 602, the first voltage 608 is controlled. The pull-up impedance code 624 may be a digital code that includes one bit per transistor in the pull-up impedance circuit 602. For example, the pull-up impedance code 624 may be a digital code that includes a first bit provided to transistor Q1 and a second bit provided to transistor Q2. As may be appreciated, the pull-up impedance circuit 602 may have any suitable number of transistors (e.g., 1, 2, 3, 4, 5, 6, 7, 8, 10, 20, etc.) coupled to a resistor R1. Accordingly, the pull-up impedance code 624 may have any suitable number of bits (e.g., 1, 2, 3, 4, 5, 6, 7, 8, 10, 20, etc.).

In response to the comparison output 618 indicating that the multiplexer output 614 is greater than the reference voltage 616, the state machine 620 may adjust the pull-up impedance code 624 to turn off one or more transistors of the pull-up impedance circuit 602 (e.g., if the multiplexer 606 selects the first voltage 608 as the multiplexer output 614). By turning off one or more transistors of the pull-up impedance circuit 602, the impedance of the pull-up impedance circuit 602 may increase, thereby reducing the first voltage 608 provided to the multiplexer 606. Thus, the multiplexer output 614 (e.g., if the first voltage 608 is selected) may be reduced toward the reference voltage 616.

In response to the comparison output 618 indicating that the multiplexer output 614 is less than the reference voltage 616, the state machine 620 may adjust the pull-up impedance code 624 to turn on one or more transistors of the pull-up impedance circuit 602 (e.g., if the multiplexer 606 selects the first voltage 608 as the multiplexer output 614). By turning on one or more transistors of the pull-up impedance circuit 602, the impedance of the pull-up impedance circuit 602 may decrease, thereby increasing the first voltage 608 provided to the multiplexer 606. Thus, the multiplexer output 614 (e.g., if the first voltage 608 is selected) may be increased toward the reference voltage 616.

As may be appreciated, the state machine 620 may continue to adjust the pull-up impedance code 624 to turn on and/or off transistors until the first voltage 608 is as close as possible to the reference voltage 616. In certain embodiments, the state machine 620 may ensure that the pull-up impedance code 624 turns on and/or off transistors until the first voltage 608 is as close as possible to the reference voltage 616, but not greater than the reference voltage 616. For example, in response to the pull-up impedance code 624 resulting in the first voltage 608 being greater than the reference voltage 616, the state machine 620 may adjust the pull-up impedance code 624 so that the first voltage 608 is less than the reference voltage 616 (e.g., rounding down).

In the illustrated embodiment of FIG. 6, the first voltage 608 is produced by providing a positive supply voltage 628 (e.g., VDDO) to one side of the pull-up impedance circuit 602. The positive supply voltage 628 may be any suitable positive voltage. Furthermore, a first current source 630 (e.g., ISINK) is provided to another side of the pull-up impedance circuit 602. The first current source 630 is produced by a reference current generator 632 (e.g., IREF generator) that uses the reference voltage 616 as an input and determines the first current source 630 based on the reference voltage 616 and a resistor R3. In one embodiment, the first current source 630 may have a current equal to the reference voltage 616 divided by the resistor R3. In some embodiments, the resistor R3 may be an external resistor. The first current source 630 directs current flow between the positive supply voltage 628 and a negative supply voltage 634 (e.g., VSSO). The negative supply voltage 634 may be any suitable negative voltage and may be substantially equal to the positive supply voltage 628 but opposite in polarity. For example, if the positive supply voltage 628 is +5 volts, the negative supply voltage 634 may be −5 volts.

The pull-down impedance code 626 is provided from the state machine 620 to the pull-down impedance circuit 604 to control an impedance of the pull-down impedance circuit 604. By controlling the impedance of the pull-down impedance circuit 604, the second voltage 610 is controlled. The pull-down impedance code 626 may be a digital code that includes one bit per transistor in the pull-down impedance circuit 604. For example, the pull-down impedance code 626 may be a digital code that includes a first bit provided to transistor Q5 and a second bit provided to transistor Q6. As may be appreciated, the pull-down impedance circuit 604 may have any suitable number of transistors (e.g., 1, 2, 3, 4, 5, 6, 7, 8, 10, 20, etc.) coupled to a resistor R2. Accordingly, the pull-down impedance code 626 may have any suitable number of bits (e.g., 1, 2, 3, 4, 5, 6, 7, 8, 10, 20, etc.).

In response to the comparison output 618 indicating that the multiplexer output 614 is greater than the reference voltage 616, the state machine 620 may adjust the pull-down impedance code 626 to turn off one or more transistors of the pull-down impedance circuit 604 (e.g., if the multiplexer 606 selects the second voltage 610 as the multiplexer output 614). By turning off one or more transistors of the pull-down impedance circuit 604, the impedance of the pull-down impedance circuit 604 may increase, thereby reducing the second voltage 610 provided to the multiplexer 606. Thus, the multiplexer output 614 (e.g., if the second voltage 610 is selected) may be reduced toward the reference voltage 616.

In response to the comparison output 618 indicating that the multiplexer output 614 is less than the reference voltage 616, the state machine 620 may adjust the pull-down impedance code 626 to turn on one or more transistors of the pull-down impedance circuit 604 (e.g., if the multiplexer 606 selects the second voltage 610 as the multiplexer output 614). By turning on one or more transistors of the pull-down impedance circuit 604, the impedance of the pull-down impedance circuit 604 may decrease, thereby increasing the second voltage 610 provided to the multiplexer 606. Thus, the multiplexer output 614 (e.g., if the second voltage 610 is selected) may be increased toward the reference voltage 616.

As may be appreciated, the state machine 620 may continue to adjust the pull-down impedance code 626 to turn on and/or off transistors until the second voltage 610 is as close as possible to the reference voltage 616. In certain embodiments, the state machine 620 may ensure that the pull-down impedance code 626 turns on and/or off transistors until the second voltage 610 is as close as possible to the reference voltage 616, but not less than the reference voltage 616. For example, in response to the pull-down impedance code 626 resulting in the second voltage 610 being greater than the reference voltage 616, the state machine 620 may adjust the pull-down impedance code 626 so that the first voltage 608 is more than the reference voltage 616 (e.g., rounding up).

In the illustrated embodiment of FIG. 6, the second voltage 610 is produced by providing the negative supply voltage 634 to one side of the pull-down impedance circuit 604. The negative supply voltage 634 may be any suitable negative voltage. Furthermore, a second current source 636 (e.g., ISOURCE) is provided to another side of the pull-down impedance circuit 604. The second current source 636 is produced by the reference current generator 632. In one embodiment, the second current source 636 may have a current equal to the reference voltage 616 divided by the resistor R3. In some embodiments, the resistor R3 may be an external resistor. The second current source 636 directs current flow between the negative supply voltage 634 and the positive supply voltage 628.

To perform a calibration operation, in one embodiment, the state machine 620 may first control the multiplexer 606 to output the first voltage 608 as the multiplexer output 614. In other embodiments, a device separate from the state machine 620 (e.g., such as a controller described herein) may control the multiplexer 606 to output the first voltage 608 as the multiplexer output 614. Then, the state machine 620 may adjust the pull-up impedance code 624 until the comparison output 618 indicates that the multiplexer output 614 is as close as possible to the reference voltage 616. Next, the state machine 620 may output a pull-up impedance completion output indicator 638 (e.g., pdone, calibration completion output) to indicate that the pull-up impedance code 624 is determined. In one embodiment, the state machine 620 may next control the multiplexer 606 to output the second voltage 610 as the multiplexer output 614. In other embodiments, a device separate from the state machine 620 (e.g., such as a controller described herein) may control the multiplexer 606 to output the second voltage 610 as the multiplexer output 614 in response to receiving the pull-up impedance completion output indicator 638. Then, the state machine 620 may adjust the pull-down impedance code 626 until the comparison output 618 indicates that the multiplexer output 614 is as close as possible to the reference voltage 616. Next, the state machine 620 may output a pull-down impedance completion output indicator 640 (e.g., ndone, calibration completion output) to indicate that the pull-down impedance code 626 is determined. In various embodiments, the state machine 620 may first determine the pull-down impedance code 626, then determine the pull-up impedance code 624. In certain embodiments, the pull-up impedance code 624 and/or the pull-down impedance code 626 may be provided to the I/O driver 404.

As may be appreciated, the pull-up impedance code 624 and/or the pull-down impedance code 626 may result in the corresponding first voltage 608 and/or second voltage 610 differing slightly from the reference voltage 616. For example, a five-bit pull-up impedance code 624 of "10110" may produce a first voltage 608 of 2.42 volts and a five-bit pull-up impedance code 624 of "10111" may produce a first voltage 608 of 2.52 volts. Each of these pull-up impedance codes 624 produce a first voltage 608 that differs slightly from a reference voltage 616 of 2.50 volts. However, because the pull-up impedance code 624 is a digital value, it may not be able to equal the reference voltage 616. Such variation may result in errors produced by the I/O driver 404 using the pull-up impedance code 624 and/or the pull-down impedance code 626. A quantization error correction device 642 (e.g., control circuit) may be used to reduce such errors.

In addition to providing the pull-up impedance completion output indicator 638 and the pull-down impedance completion output indicator 640 to the quantization error correction device 642, the state machine 620 may output the pull-up impedance code 624 and the pull-down impedance code 626. The quantization error correction device 642 receives the pull-up impedance completion output indicator 638 and the pull-down impedance completion output indicator 640 indicating that the pull-up impedance code 624 and the pull-down impedance code 626 are determined. In response to receiving the pull-up impedance completion output indicator 638 and the pull-down impedance completion output indicator 640, the quantization error correction device 642 enables a positive analog calibration output 644 and a negative analog calibration output 646.

The positive analog calibration output 644 turns on a transistor Q3 and powers a first amplifier 648. The first amplifier 648 receives two inputs including the first voltage 608 and the reference voltage 616 and produces a positive analog compensation 650 (e.g., analog compensation value, analog impedance compensation value, analog impedance). The positive analog compensation 650 is provided to a transistor Q4 to adjust the first voltage 608 until the first voltage 608 substantially matches the reference voltage 616 (e.g., the first voltage 608 is within 1%, 2%, 3%, and/or 5% of the reference voltage 616). At a time in which the first voltage 608 substantially matches the reference voltage 616, the positive analog compensation 650 may be considered determined. In some embodiments, the positive analog calibration output 650 may be provided to the I/O driver 404. In certain embodiments, the transistor Q3, the transistor Q4, and/or the first amplifier 648 may be part of a first feedback circuit.

The negative analog calibration output 646 turns on a transistor Q7 and powers a second amplifier 652. The second amplifier 652 receives two inputs including the second voltage 610 and the reference voltage 616 and produces a negative analog compensation 654 (e.g., analog compensation value, analog impedance compensation value, analog impedance). The negative analog compensation 654 is provided to a transistor Q8 to adjust the second voltage 610 until the second voltage 610 substantially matches the reference voltage 616 (e.g., the second voltage 610 is within 1%, 2%, 3%, and/or 5% of the reference voltage 616). At a time in which the second voltage 610 substantially matches the reference voltage 616, the negative analog compensation 654 may be considered determined. In some embodiments, the negative analog compensation 654 may be provided to the I/O driver 404. In certain embodiments, the transistor Q7, the transistor Q8, and/or the second amplifier 652 may be part of a second feedback circuit.

In response to the positive analog compensation 650 and the negative analog compensation 654 being determined, the quantization error correction device 642 may output an analog calibration completion indicator 656 (e.g., a calibration adjustment completion output). In some embodiments, the quantization error correction device 642 may output the analog calibration completion indicator 656 after waiting a predetermined period of time after providing the positive analog calibration output 644 and the negative analog calibration output 646. The state machine 620 may receive the analog calibration completion indicator 656 and may output a calibration completion indicator 658.

As may be appreciated, by using the positive calibration code 624 and the positive analog compensation 650, digital error that may exist by using only the positive calibration code 624 may be reduced. In some embodiments, a voltage produced by the positive calibration code 624 (e.g., analog equivalent) plus the positive analog compensation 650 may substantially equal the reference voltage 616. Furthermore, by using the negative calibration code 626 and the negative analog compensation 654, digital error that may exist by using only the negative calibration code 626 may be reduced. In some embodiments, a voltage produced by the negative calibration code 626 (e.g., analog equivalent) plus the negative analog compensation 654 may substantially equal the reference voltage 616.

The transistors Q1, Q2, Q3, Q4, Q5, Q6, Q7, and Q8 may be any suitable transistors. In certain embodiments, the transistors Q1, Q2, Q3, Q4, Q5, Q6, Q7, and Q8 may be FETs, such as MOSFETs. Moreover, in some embodiments, Q1, Q2, Q3, and Q4 may be NMOS, and Q5, Q6, Q7, and Q8 may be PMOS. In other embodiments, Q1, Q2, Q3, and Q4 may be PMOS, and Q5, Q6, Q7, and Q8 may be NMOS.

Figure 7:
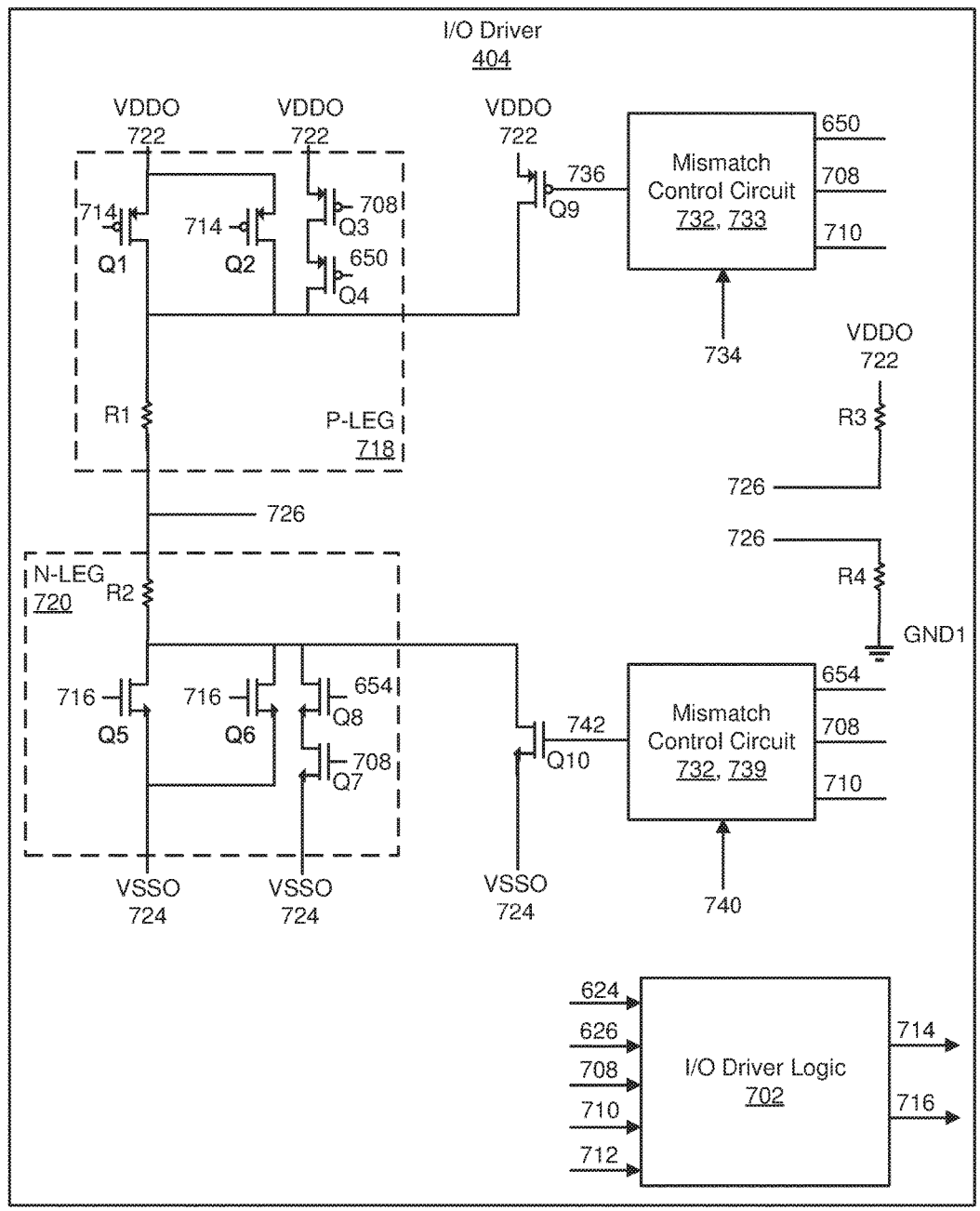
FIG. 7 is a schematic block diagram illustrating one embodiment of an input/output device.

FIG. 7 depicts one embodiment of the I/O driver 404 (e.g., impedance matching circuit). The I/O driver 404 may be used to drive input and/or output operations. The I/O driver includes I/O driver logic 702. The I/O driver logic 702 may include any suitable hardware and/or software to perform its functions. In one embodiment, the I/O driver logic 702 receives the positive calibration code 624 and the negative calibration code 626 from the compensation device 402. Moreover, the I/O driver logic 702 receives inputs including data 708, an output enable signal 710, and a control signal 712. The I/O driver logic 702 produces an internal positive calibration code 714 and an internal negative calibration code 716 based on the positive calibration code 624, the negative calibration code 626, and/or the other received inputs.

In certain embodiments, the internal positive calibration code 714, the data 708, and the positive analog compensation 650 from the compensation device 402 are provided to a pull-up impedance circuit 718 (e.g., p-leg). In some embodiments, the data 708 may be used to control a gate of a transistor Q3 to reduce coupling that may result between the data 708 and the positive analog compensation 650. Moreover, in various embodiments, the internal negative calibration code 716, the data 708, and the negative analog compensation 654 from the compensation device 402 are provided to a pull-down impedance circuit 720 (e.g., n-leg). In some embodiments, the data 708 may be used to control a gate of a transistor Q7 to reduce coupling that may result between the data 708 and the negative analog compensation 654.

A positive supply voltage 722 (e.g., VDDO) provides power to one side of the pull-up impedance circuit 718, and a negative power supply 724 (e.g., VSSO) provides power to one side of the pull-down impedance circuit 720. A voltage 726 (e.g., analog result) represents a voltage on a node coupled to both the pull-up impedance circuit 718 and the pull-down impedance circuit 720.

The I/O driver 404 includes two mismatch control circuits 732. A first mismatch control circuit 733 receives the positive analog compensation 650, the data 708, the output enable signal 710, and a positive local trim 734 (e.g., local digital impedance output, trim digital impedance input, local digital impedance compensation value). In certain embodiments, an initial value for the positive local trim 734 is determined based on the positive calibration code 624. For example, in one embodiment, the initial value for the positive local trim 734 is determined by looking up the positive calibration code 624 in a look-up table, a database, an array, or so forth. Based on the inputs, the mismatch control circuit 733 outputs a local positive analog compensation 736 (e.g., local analog impedance output, local analog impedance compensation value). The internal positive analog compensation 736 is provided to a transistor Q9 to adjust the voltage 726. In certain embodiments, the voltage 726 is compared to a reference voltage (e.g., reference voltage 616) and the positive local trim 734 is adjusted based on a difference between the voltage 726 and the reference voltage. This feedback loop may repeat until the voltage 726 is substantially equal to the reference voltage. In response to the voltage 726 being substantially equal to the reference voltage, the I/O driver 404 may store the positive local trim 734.

A second mismatch control circuit 739 receives the negative analog compensation 654, the data 708, the output enable signal 710, and a negative local trim 740 (e.g., local digital impedance output, trim digital impedance input, local digital impedance compensation value). In certain embodiments, an initial value for the negative local trim 740 is determined based on the negative calibration code 626. For example, in one embodiment, the initial value for the negative local trim 740 is determined by looking up the negative calibration code 626 in a look-up table, a database, an array, or so forth. Based on the inputs, the mismatch control circuit 739 outputs a local negative analog compensation 742 (e.g., local analog impedance output, local analog impedance compensation value). The internal negative analog compensation 742 is provided to a transistor Q10 to adjust the voltage 726. In certain embodiments, the voltage 726 is compared to a reference voltage (e.g., reference voltage 616) and the negative local trim 740 is adjusted based on a difference between the voltage 726 and the reference voltage. This feedback loop may repeat until the voltage 726 is substantially equal to the reference voltage. In response to the voltage 726 being substantially equal to the reference voltage, the I/O driver 404 may store the negative local trim 740.

The transistors Q1, Q2, Q3, Q4, Q5, Q6, Q7, Q8, Q9, and Q10 may be any suitable transistors. In certain embodiments, the transistors Q1, Q2, Q3, Q4, Q5, Q6, Q7, Q8, Q9, and Q10 may be FETs, such as MOSFETs. Moreover, in some embodiments, Q1, Q2, Q3, Q4, and Q9 may be NMOS, and Q5, Q6, Q7, Q8, and Q10 may be PMOS. In other embodiments, Q1, Q2, Q3, Q4, and Q9 may be PMOS, and Q5, Q6, Q7, Q8, and Q10 may be NMOS.

As may be appreciated, by determining and/or storing the positive local trim 734 and/or the negative local trim 740, a mismatch error that results because of differences between the components of the compensation device 402 and the I/O driver 404 may be reduced.

Figure 8:
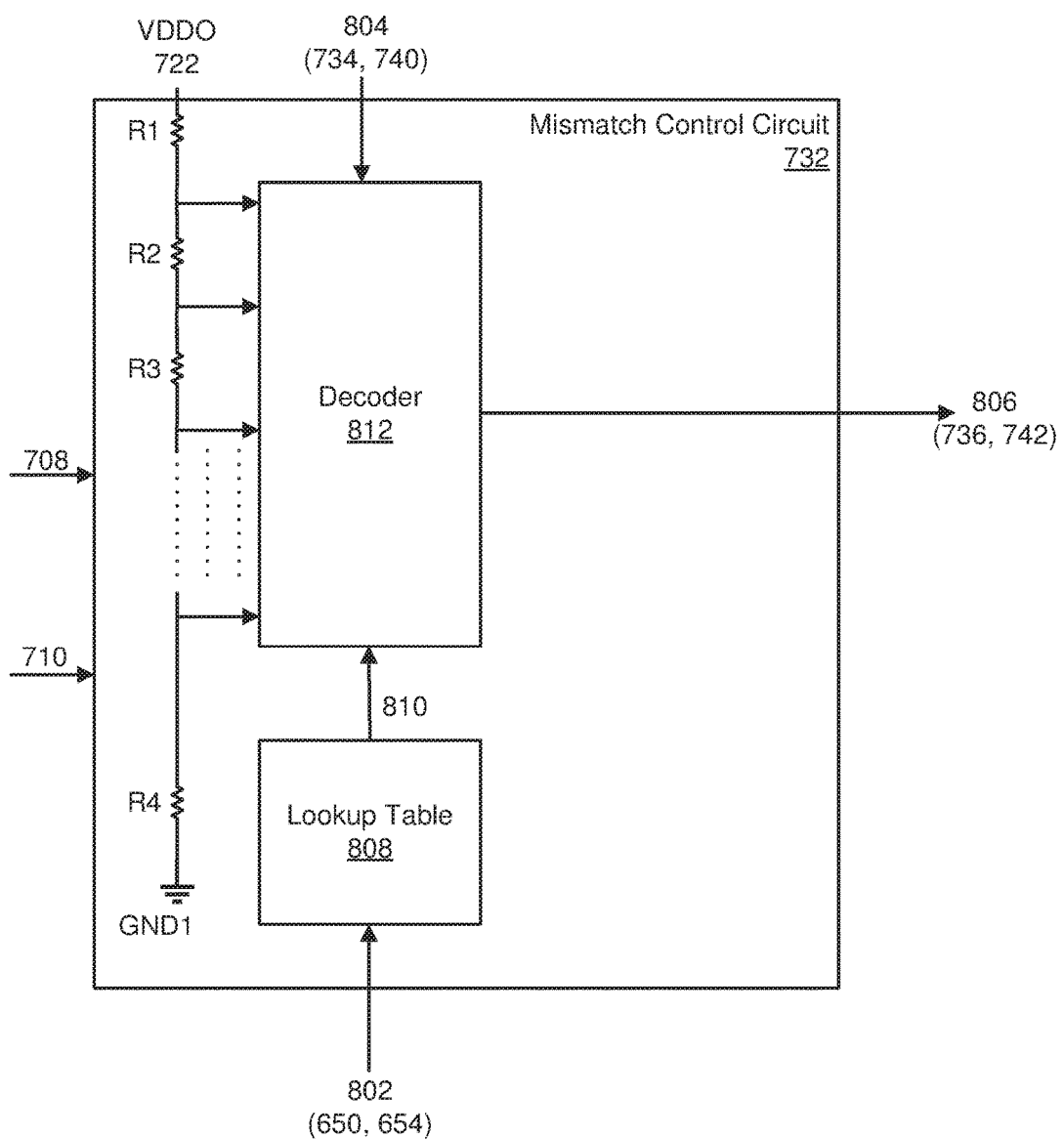
FIG. 8 is a schematic block diagram illustrating one embodiment of a mismatch control circuit.

FIG. 8 depicts one embodiment of the mismatch control circuit 732. The mismatch control circuit 723 receives an analog compensation 802 (e.g., positive analog compensation 650, negative analog compensation 654), the data 708, the output enable signal 710, and a local trim 804 (e.g., positive local trim 734, negative local trim 740). In certain embodiments, an initial value for the local trim 804 is determined based on either the positive calibration code 624 or the negative calibration code 626. For example, in one embodiment, the initial value for the local trim 804 is determined by looking up the positive calibration code 624 in a look-up table, a database, an array, or so forth. Based on the inputs, the mismatch control circuit 732 outputs a local analog compensation 806 (e.g., local positive analog compensation 736, local negative analog compensation 742). The internal analog compensation 806 is provided to a transistor to adjust a voltage. In certain embodiments, the voltage is compared to a reference voltage (e.g., reference voltage 616) and the local trim 804 is adjusted based on a difference between the voltage and the reference voltage. This feedback loop may repeat until the voltage is substantially equal to the reference voltage. In response to the voltage being substantially equal to the reference voltage, the I/O driver 404 may store the local trim 804. In some embodiments, the local trim 804 may be stored in NAND and/or in fuse ROM.

The mismatch control circuit 732 includes a lookup table 808 that may lookup the analog compensation 802 to provide initialization data 810 to a decoder 812. The decoder 812 may use the initialization data 810 in conjunction with the local trim 804, the resistor network (e.g., including R1, R2, R3, R4, and so forth), the data 708, and the output enable signal 710 to produce the internal analog compensation 806.

Figure 9:
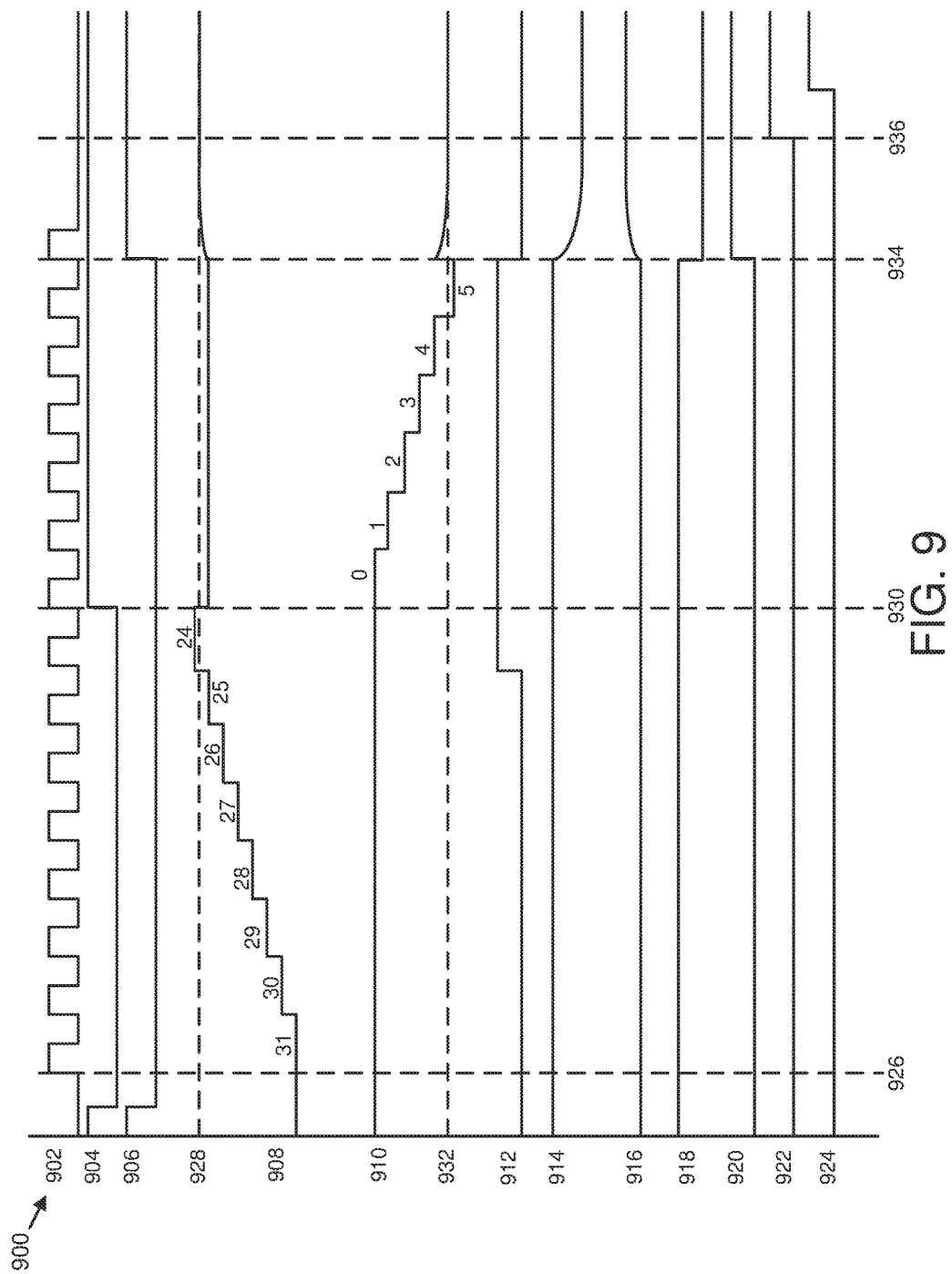
FIG. 9 is a timing diagram illustrating one embodiment of signals corresponding to a compensation device.

FIG. 9 is a timing diagram 900 illustrating one embodiment of signals corresponding to a compensation device. The timing diagram 900 includes a clock signal 902, a pull-up impedance completion output indicator 904, a pull-down impedance completion output indicator 906, a first voltage 908, a second voltage 910, a comparison output 912, a positive analog compensation 914, a negative analog compensation 916, a positive analog calibration output 918, a negative analog calibration output 920, an analog calibration completion indicator 922, and a calibration completion indicator 924.

The timing diagram 900 illustrates one embodiment of the operation of the compensation device 402. As may be appreciated, logic high (e.g., "1") and logic low (e.g., "0") signals are used herein, but in other embodiments, a logic high may be replaced with a logic low and/or a logic low may be replaced with a logic high. At a first time 926, in response to a change in the clock signal 902 and both of the pull-up impedance completion output indicator 904 and the pull-down impedance completion output indicator 906 being a logic low, pull-up impedance calibration is performed.

To perform the pull-up impedance calibration, a pull-up impedance code is adjusted to change the first voltage 908. As illustrated, the first voltage 908 changes as the pull-up impedance code changes. The pull-up impedance code is illustrated with the numbers 31, 30, 29, 28, 27, 26, 25, and 24 representing the pull-up impedance code. In response to the pull-up impedance code being 24, the first voltage 908 passes a reference voltage 928 (e.g., VDDO/2). Moreover, in response to the first voltage 908 passing the reference voltage 928, the comparison output 912 transitions from a logic low to a logic high.

At a second time 930, the pull-up impedance calibration completes by adjusting the pull-up impedance code from 24 to 25 to reduce the first voltage 908 to be less than the reference voltage 928 and transitioning the pull-up impedance completion output indicator 904 to a logic high. As a result of the pull-up impedance completion output indicator 904 transitioning to a logic high, pull-down impedance calibration is performed.

To perform the pull-down impedance calibration, a pull-down impedance code is adjusted to change the second voltage 910. As illustrated, the second voltage 910 changes as the pull-down impedance code changes. The pull-down impedance code is illustrated with the numbers 0, 1, 2, 3, 4, and 5 representing the pull-down impedance code. In response to the pull-down impedance code being 5, the second voltage 910 passes a reference voltage 932 (e.g., VDDO/2). Moreover, in response to the second voltage 910 passing the reference voltage 932, the comparison output 912 transitions from a logic high to a logic low.

At a third time 934, the pull-down impedance calibration completes by adjusting the pull-down impedance code from 5 to 4 to increase the second voltage 910 to be greater than the reference voltage 932 and transitioning the pull-down impedance completion output indicator 906 to a logic high. As a result of the pull-down impedance completion output indicator 906 transitioning to a logic high and the pull-up impedance completion output indicator 904 being a logic high, the positive analog calibration output 918 transitions from a logic high to a logic low and the negative analog calibration output 920 transitions from a logic low to a logic high to perform quantization error correction.

To perform quantization error correction, the positive analog compensation 914 is adjusted so that the first voltage 908 substantially matches the reference voltage 928 and the negative analog compensation 916 is adjusted so that the second voltage 910 substantially matches the reference voltage 932.

At a fourth time 936, quantization error correction is complete resulting in the analog calibration completion indicator 922 transitioning from a logic low to a logic high to show that analog calibration is complete. Furthermore, as a result of the analog calibration completion indicator 922 transitioning to a logic high, the calibration completion indicator 924 transitions from a logic low to a logic high and calibration is complete.

Figure 10:
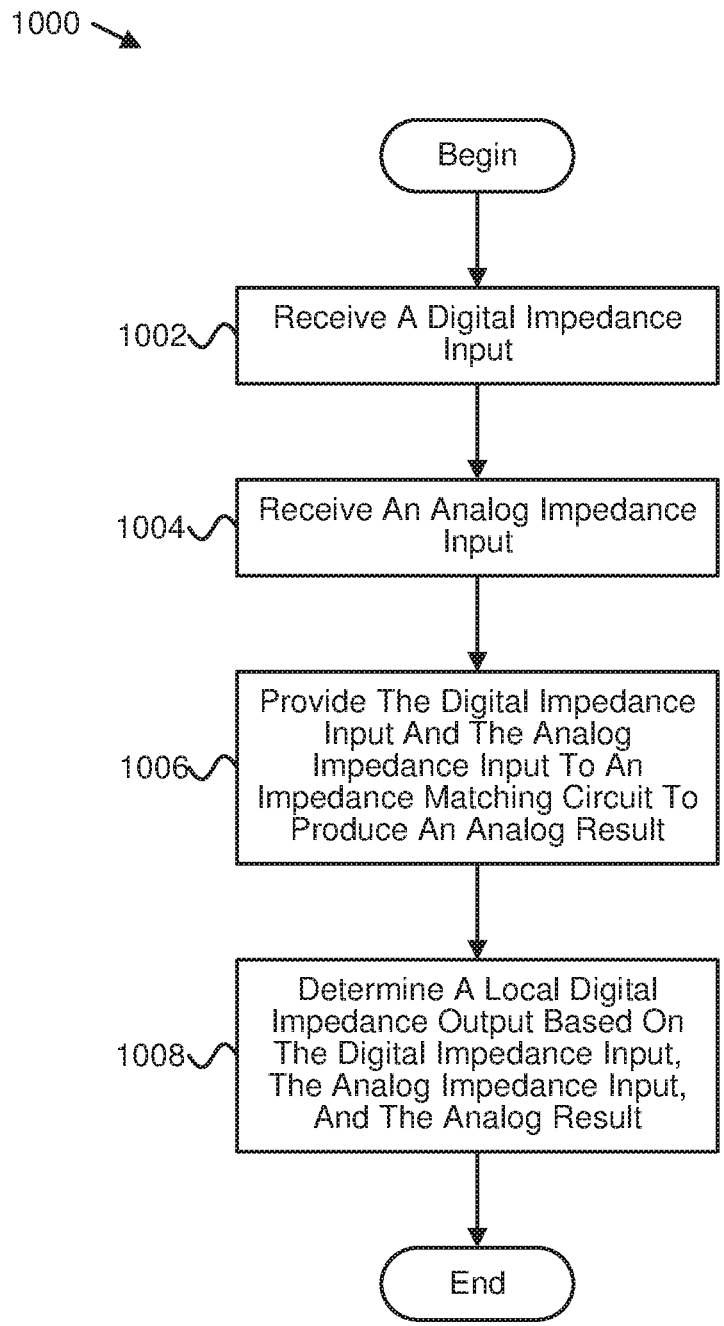
FIG. 10 is a schematic flow chart diagram illustrating one embodiment of a method for on-die impedance calibration.

FIG. 10 depicts one embodiment of a method 1000 for on-die impedance calibration. The method 1000 begins, and an I/O driver 404 receives 1002 a digital impedance input and receives 1004 an analog impedance input. The I/O driver 404 provides 1006 the digital impedance input and the analog impedance input to an impedance matching circuit to produce an analog result. The I/O driver 404 determines 1008 a local digital impedance output based on the digital impedance input, the analog impedance input, and the analog result, and the method 1000 ends. In certain embodiments, determining 1008 a local digital impedance output includes applying a trim digital impedance input to an impedance matching circuit. In some embodiments, an initial value for a trim digital impedance input is determined based on a digital impedance input. In various embodiments, an initial value for a trim digital impedance input is determined by looking up a digital impedance input in a table. In certain embodiments, the method 1000 includes adjusting a trim digital impedance input until an analog result matches a predetermined voltage. In some embodiments, the method 1000 includes storing a trim digital impedance input as a local digital impedance output in response to an analog result matching a predetermined voltage. In various embodiments, the method 1000 includes producing a local analog impedance output based on a local digital impedance output and an analog impedance input.

A means for generating an analog impedance compensation value, for an electrical signal driver (e.g., I/O driver 404), based on a digital impedance compensation value, in various embodiments, may include a calibration component 150, a calibration circuit 302, a calibration adjustment circuit 304, a feedback circuit 306, a control circuit 308, a compensation device 402, an on-die controller 220, a die state machine 222, other logic hardware, and/or other executable code stored on a computer readable storage medium. Other embodiments may include similar or equivalent means for generating an analog impedance compensation value, for an electrical signal driver, based on a digital impedance compensation value.

A means for generating a local analog impedance compensation value at an electrical signal driver, in various embodiments, may include a calibration component 150, a calibration circuit 302, a calibration adjustment circuit 304, a feedback circuit 306, a control circuit 308, a compensation device 402, an on-die controller 220, a die state machine 222, other logic hardware, and/or other executable code stored on a computer readable storage medium. Other embodiments may include similar or equivalent means for generating a local analog impedance compensation value at an electrical signal driver.

A means for generating an output voltage based on a digital impedance compensation value, an analog impedance compensation value, and a local analog impedance compensation value, in various embodiments, may include a calibration component 150, a calibration circuit 302, a calibration adjustment circuit 304, a feedback circuit 306, a control circuit 308, a compensation device 402, an on-die controller 220, a die state machine 222, other logic hardware, and/or other executable code stored on a computer readable storage medium. Other embodiments may include similar or equivalent means for generating an output voltage based on a digital impedance compensation value, an analog impedance compensation value, and a local analog impedance compensation value. In some embodiments, the means for generating an output voltage based on a digital impedance compensation value, an analog impedance compensation value, and a local analog impedance compensation value may include means for receiving an analog impedance compensation value and a local digital impedance compensation value, and means for producing a local analog impedance compensation value based on an analog impedance compensation value and a local digital impedance compensation value.

A means for means for accessing a local digital impedance compensation value at an electrical signal driver, in various embodiments, may include a calibration component 150, a calibration circuit 302, a calibration adjustment circuit 304, a feedback circuit 306, a control circuit 308, a compensation device 402, an on-die controller 220, a die state machine 222, other logic hardware, and/or other executable code stored on a computer readable storage medium. Other embodiments may include similar or equivalent means for accessing a local digital impedance compensation value at an electrical signal driver.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
    a calibration circuit that determines a digital compensation value for an input/output driver;
    a calibration adjustment circuit that provides the digital compensation value to the calibration circuit to produce an analog output corresponding to the digital compensation value; and
    a feedback circuit that provides the analog output as feedback to the calibration circuit to produce an analog compensation value.

2. The apparatus of claim 1, wherein the digital compensation value is determined from an analog value.

3. The apparatus of claim 2, wherein the digital compensation value is rounded down to a nearest digital value that has an analog equivalent that is less than the analog value.

4. The apparatus of claim 3, wherein the analog value is a sum of the analog equivalent and the analog compensation value.

5. The apparatus of claim 1, wherein the calibration circuit produces a calibration completion output in response to determining the digital compensation value.

6. The apparatus of claim 5, wherein the feedback circuit produces the analog compensation value in response to the calibration completion output being produced.

7. The apparatus of claim 5, further comprising a control circuit that receives an indication of the calibration completion output and provides an enable output to the feedback circuit to enable the feedback circuit.

8. The apparatus of claim 7, wherein the control circuit provides a calibration adjustment completion output in response to producing the analog compensation value.

9. The apparatus of claim 1, wherein the feedback circuit comprises an amplifier that outputs the analog compensation value based on inputs comprising the analog output and a reference voltage based on a supply voltage.

10. The apparatus of claim 1, wherein the calibration circuit determines a plurality of digital compensation values comprising the digital compensation value, and the feedback circuit determines a plurality of analog compensation values comprising the analog compensation value.

11. A method comprising:
receiving a digital impedance input;
receiving an analog impedance input;
providing the digital impedance input and the analog impedance input to an impedance matching circuit to produce an analog result; and
determining a local digital impedance output based on the digital impedance input, the analog impedance input, and the analog result.

12. The method of claim 11, wherein determining the local digital impedance output comprises applying a trim digital impedance input to the impedance matching circuit.

13. The method of claim 12, wherein an initial value for the trim digital impedance input is determined based on the digital impedance input.

14. The method of claim 13, wherein the initial value for the trim digital impedance input is determined by looking up the digital impedance input in a table.

15. The method of claim 12, further comprising adjusting the trim digital impedance input until the analog result matches a predetermined voltage.

16. The method of claim 15, further comprising storing the trim digital impedance input as the local digital impedance output in response to the analog result matching the predetermined voltage.

17. The method of claim 11, further comprising producing a local analog impedance output based on the local digital impedance output and the analog impedance input.

18. An apparatus comprising:
means for generating an analog impedance compensation value, for an electrical signal driver, based on a digital impedance compensation value;
means for generating a local analog impedance compensation value at the electrical signal driver; and
means for generating an output voltage based on the digital impedance compensation value, the analog impedance compensation value, and the local analog impedance compensation value.

19. The apparatus of claim 18, further comprising means for accessing a local digital impedance compensation value at the electrical signal driver.

20. The apparatus of claim 18, wherein the means for generating the local analog impedance compensation value comprises means for receiving the analog impedance compensation value and the local digital impedance compensation value, and means for producing the local analog impedance compensation value based on the analog impedance compensation value and the local digital impedance compensation value.

* * * * *